(12) United States Patent
Hou

(10) Patent No.: US 9,042,250 B2
(45) Date of Patent: May 26, 2015

(54) MULTI-SIM MULTI-STANDBY COMMUNICATION DEVICE, AND GAIN OBTAINING METHOD FOR NON-TRAFFIC CARD THEREOF

(75) Inventor: Qingzhu Hou, Shanghai (CN)

(73) Assignee: SPREADTRUM COMMUNICATIONS(SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 13/579,975

(22) PCT Filed: Jul. 12, 2011

(86) PCT No.: PCT/CN2011/077053
§ 371 (c)(1),
(2), (4) Date: Aug. 20, 2012

(87) PCT Pub. No.: WO2012/034448
PCT Pub. Date: Mar. 22, 2012

(65) Prior Publication Data
US 2012/0314610 A1    Dec. 13, 2012

(30) Foreign Application Priority Data
Sep. 16, 2010 (CN) .......................... 2010 1 0288039

(51) Int. Cl.
*H04W 4/00* (2009.01)
*H03G 3/30* (2006.01)

(52) U.S. Cl.
CPC ............. *H04W 4/003* (2013.01); *H03G 3/3073* (2013.01); *H03G 3/3078* (2013.01)

(58) Field of Classification Search
USPC ........................................................ 370/252
See application file for complete search history.

(56) References Cited

U.S. PATENT DOCUMENTS

| 2002/0151277 | A1* | 10/2002 | Fujiwara | ...................... 455/67.1 |
| 2009/0180435 | A1* | 7/2009 | Sarkar | ........................... 370/330 |
| 2010/0238816 | A1* | 9/2010 | Suh et al. | ....................... 370/252 |
| 2010/0304782 | A1* | 12/2010 | Chang et al. | ................ 455/552.1 |
| 2011/0281570 | A1* | 11/2011 | Shi et al. | ....................... 455/418 |

FOREIGN PATENT DOCUMENTS

| CN | 101313615 A | 11/2008 |
| CN | 101409902 A | 4/2009 |
| CN | 101951635 A | 1/2011 |
| WO | 2009089287 A2 | 7/2009 |

\* cited by examiner

*Primary Examiner* — Huy D Vu
*Assistant Examiner* — Adnan Baig
(74) *Attorney, Agent, or Firm* — Kilpatrick Townsend & Stockton LLP

(57) ABSTRACT

A gain obtaining method for a non traffic card of a multi-card multi-standby communication device, comprising: acquiring spare time information of a traffic card (S101); monitoring a cell broadcast channel of a non traffic card in a spare time of the traffic card, to measure a current signal intensity of a cell (S102); and calculating a signal gain required by the non traffic card for correctly receiving data according to the signal intensity (S103). Based on the gain tracking method for a non-traffic card, a multi-card multi-standby communication device is further provided. Through the technical solutions, the traffic card can track the gain required by the non traffic card for correctly receiving data during the implementation of a service.

21 Claims, 3 Drawing Sheets

MULTI-SIM MULTI-STANDBY COMMUNICATION DEVICE, AND GAIN OBTAINING METHOD FOR NON-TRAFFIC CARD THEREOF

CROSS REFERENCE TO RELATED APPLICATIONS

The present application is a Section 371 National Stage Application of International Application No. PCT/CN2011/077053, filed on Jul. 12, 2011. which claims priority to Chinese patent application No. 201010288039.X, filed on Sep. 16, 2010, and entitled "Multi-card Multi-standby Communication Device, and Gain Tracking Method for Non-service Card thereof", the entire disclosure of which is incorporated herein by reference.

FIELD OF THE DISCLOSURE

The present disclosure generally relates to communication field, and more particularly, to a multi-card multi-standby communication device and a gain tracking method for one or more non-service cards thereof.

BACKGROUND OF THE DISCLOSURE

With the rapid development of communication technology, information exchange among people appears more and more frequently. A single mobile phone may not meet the needs of people, especially those engaged in marketing or management, who may have to carry two or more mobile phones to meet the communication requirements, which brings inconvenience. Nowadays, multi-SIM multi-standby communication devices are emerging, which makes a user only need to carry one communication device with more than one Subscriber Identity Module (SIM) card or more than one User Identity Mode (UIM) card. It is far more convenient than the conventional way to carry several mobile phones.

Globe System of Mobile Communication (GSM) is one of the most widely used mobile communication systems. In general, if a subscriber wants to use multiple phone numbers in a single device in GSM system, the following solutions may be employed.

Firstly, a multi-SIM single-standby communication device may be used. In this communication device, there is more than one SIM card simultaneously, however, only one SIM card can be set in a standby state at a same time, and switching among the multiple SIM cards is executed by hardware circuits, which is generally selected when the device is powered on. Due to the effect of a protocol stack, the switching among the multiple SIM cards can not be executed dynamically when the communication device is in operation. For this matter, the mobile phone system needs to be rebooted (mainly reboot protocol stack/upper-layer software) to switch among the multiple SIM cards.

Secondly, a multi-SIM multi-standby communication device may be used to overcome the disadvantages in the multi-SIM single-standby communication device, in which multiple SIM cards can be standby simultaneously just like carrying multiple mobile phones, thereby improving practical application greatly.

An early multi-SIM multi-standby communication device actually possesses multiple sets of systems, generally two, each of which has a radio frequency module, a base band module, and a protocol stack respectively. The communication device having multiple systems can realize multiple SIM cards respectively in standby or communicating state, which is also referred to as a multi-SIM multi-standby multi-communicating communication device. However, this kind of communication device, with multiple systems utilized, suffers an additional cost and power consumption, and an increased size, which causes inconvenience. In view of radio frequency modules, allowing for co-channel interferences, one radio frequency (Rf) module is generally configured at the top of a mobile phone, and the other at the end of the mobile phone, so as to reduce interferences. Generally, the distance between the two antennae is greater than 100 mm.

Later multi-SIM multi-standby mobile phone is a kind of multi-SIM multi-standby single-communicating communication device, which uses only one set of communication module, including such as a radio frequency module and a base band module, compared to the early multiple systems. Because the upper protocol stacks needs to cooperate, the protocol stacks which operate independently in the early multi-SIM multi-standby multi-communicating communication device needs a close integration. Although the practical operation becomes more complicated, the multi-SIM multi-standby function may be achieved. Generally, multiple cards may be set in standby states simultaneously by monitoring control channels in turn under the control of the protocol stacks.

However, for a multi-SIM multi-standby single-communicating communication device, with only one set of communication module, while one of the SIM cards communicates with a base station through the communication module, (namely, the SIM card is conducting a communication service), the other SIM card(s) has to be waiting to receive messages on a cell's BCH (broadcast channel), such as paging messages or system messages, until the SIM card in traffic finishes its service.

FIG. 1 is a schematic diagram illustrating data reception of a traffic card and a non-traffic card in prior art. As shown in FIG. 1, the horizontal axis (T) represents time. A SIM card A starts to conduct a service (such as GSM service) at T0, and receives traffic frame on a traffic channel (TCH) until T1. In terms of GSM communication protocol, during the time period from T0 to T1, data receiving is only performed in serving cell and the neighboring cell of the SIM card which is conducting a service. After T1, both the SIM card A and SIM card B enter an idle state, paging information of the SIM card A and SIM card B may be received through Common Control Channel (CCCH). However, because the SIM card B does not receive data during the time period from T0 to T1, a gain of the SIM card B to receive data correctly is uncertain. FIG. 2 is a schematic diagram of variation of the signal gain needed for the SIM card B shown in FIG. 1 to receive data correctly. As shown in FIG. 2, the horizontal axis T represents time, and the vertical axis E represents gain. Assuming that the gain needed for the SIM card B to receive data correctly is E1 at T0 when the SIM card A starts to conduct a service, however, during the period from T0 to T1, the gain may vary due to, generally, the change of the signal intensity caused by the change of the transmission paths of the signal transmitted by a base station because of the continuous change of the position of the mobile phone. However, in terms of GSM communication protocol, the signal received is within a range, generally [−110 dBm, −47 dB] a signal with too high or too low intensity may not be received correctly, therefore, there is a need to adjust the gain of the signal. Assuming that the gain needed for the SIM card B to receive data correctly is E2 at T1 when the SIM card A finishes the service, the gain needed for the SIM card B to receive data correctly is uncertain because the SIM card B has not received data during the time period from T0 to T1 as described above. If data receiving is performed in accordance with the gain at T0, it may fail to decode data in a succession of multiple packages due to the improper gain, or even lose network connection.

Chinese patent application No. 200780000267.9 discloses a method for sending and receiving wireless signal. When quality of a user link falls below a predetermined lower limit, idle time slots on other carrier waves of the current cell, corresponding to the slots of a carrier wave initially occupied by the user, are used in diversity transmitting/receiving the user's signal. When quality of the user link surpasses a predetermined upper threshold, the time slots that the user occupies on the other carrier waves are released. In this way, the quality of the user link is improved saving network resources. However, according to the disclosure, the multi-SIM multi-standby single-communicating system has difficulty to obtain signal gains of other SIM cards for receiving data correctly when one SIM card is in a communicating state.

BRIEF SUMMARY OF THE DISCLOSURE

The problem to be solved in the present disclosure is that a non-traffic card can not obtain a signal gain needed for receiving data correctly because the non-traffic card is unable to monitor a cell's BCH and to measure signal intensity when a traffic card is conducting a service.

To solve the problems described above, embodiments of the present disclosure provide a method for obtaining a gain of non-traffic card in a multi-SIM multi-standby communication device. The method includes:
  obtaining information of an idle time period of a traffic card;
  monitoring a cell's broadcast channel associated with a non-traffic card during the idle time period of the traffic card, so as to measure current signal intensity of the cell; and
  obtaining a signal gain of the non-traffic card to receive data correctly according to the signal intensity.

Optionally, the step of obtaining information of an idle time period of a traffic card includes:
  obtaining a boundary time point of a traffic frame on a traffic channel of the traffic card;
  obtaining an end time point of the traffic frame based on the boundary time point and a time period of each traffic frame; and
  obtaining the idle time period which is from the end time point of a current traffic frame to the boundary time point of a next traffic frame.

Optionally, the idle time period of the traffic card includes a guard time period which is a stable time period for switching frequencies; and the guard time period is not occupied while monitoring the cell's broadcast channel associated with the non-traffic card during the idle time period of the traffic card.

Optionally, the step of monitoring the cell's broadcast channel associated with the non-traffic card during the idle time period of the traffic card not occupying the guard time period is achieved by ensuring that both a start time point and an end time point for monitoring the cell's BCH associated with the non-traffic card does not fall within the guard time period.

Optionally, the method further includes monitoring a cell's broadcast channel associated with the traffic card, and the step of monitoring the cell's broadcast channel associated with the non-traffic card during the idle time period of the traffic card not occupying the time period for monitoring the cell's broadcast channel associated with the traffic card.

Optionally, the step of monitoring the cell's broadcast channel associated with the non-traffic card during the idle time period of the traffic card not occupying the time period for monitoring the cell's broadcast channel associated with the traffic card is achieved by ensuring both the start time point and the end time point for monitoring the cell's BCH associated with the non-traffic card does not fall within the time period for monitoring the cell's BCH associated with the traffic card.

Optionally, the signal intensity includes a reception voltage level, and current signal intensity of the cell is measured by measuring current reception voltage level of the cell.

Optionally, the method includes:
  measuring the reception level multiple times during a predetermined time interval;
  obtaining an average reception voltage level according to the multiple reception voltage levels; and
  obtaining the signal gain of the non-traffic card to receive data correctly based on the average reception voltage level.

Optionally, the step of obtaining the signal gain of the non-traffic card to receive data correctly includes obtaining a signal gain to receive data correctly for the non-traffic card according to a difference between the average reception voltage level and a target reception voltage level which is a reception voltage level to receive data correctly.

Optionally, the step monitoring the cell's broadcast channel of the non-traffic card includes monitoring a serving cell's broadcast channel and/or neighbouring cell's broadcast channel associated with the non-traffic card.

Optionally, there is one traffic card in conducting services, and one or more non-traffic cards.

Optionally, the traffic card and the non-traffic card use a TDMA communication network.

To solve the above problems, embodiments of the present disclosure further provide a multi-SIM multi-standby communication device. The device includes:
  a storage unit adapted for storing information of idle time period of an traffic card;
  a control unit adapted for obtaining the information of idle time period of the traffic card stored in the storage unit, and controlling a monitoring unit to monitor a cell's broadcast channel associated with a non-traffic card during the idle time period of the traffic card;
  the monitoring unit adapted for monitoring the cell's broadcast channel associated with the non-traffic card under the control of the control unit, and measuring current signal intensity of the cell; and
  a gain acquiring unit adapted for calculating signal gain of the non-traffic card needed for receiving data correctly based on the signal intensity measured by the monitoring unit.

Optionally, the control unit adapted for obtaining the information of idle time period of the traffic card stored in the storage unit further includes:
  obtaining a boundary time point of traffic frame on a traffic channel of the traffic card;
  obtaining an end time point of the traffic frame based on the boundary time point and a time period of each traffic frame; and
  obtaining the idle time period which is from the end time point of a current traffic frame to the boundary time point of a next traffic frame.

Optionally, the idle tinge period of the traffic card includes a guard time period which is a stable time period for switching frequencies; and the guard time period is not occupied while monitoring the cell's broadcast channel associated with the non-traffic card during the idle time period of the traffic card.

Optionally, the monitoring unit monitoring the cell's broadcast channel associated with the non-traffic card during the idle time period of the traffic card not occupying the guard time period is achieved by ensuring that both a start time point and an end time point for monitoring the cell's BCH associated with the non-traffic card does not fall within the guard time period.

Optionally, the monitoring unit further includes monitoring a cell's broadcast channel associated with the traffic card, and the monitoring unit monitoring the cell's broadcast channel associated with the non-traffic card during the idle time period of the traffic card not occupying the time period for monitoring the cell's broadcast channel associated with the traffic card.

Optionally, the monitoring unit monitoring the cell's broadcast chat associated with the non-traffic card during the idle time period of the traffic card not occupying the time period for monitoring the cell's broadcast channel associated with the traffic card is achieved by ensuring both the start time point and the end time point for monitoring the cell's BCH associated with the non-traffic card does not fall within the time period for monitoring the cell's BCH associated with the traffic card.

Optionally, the signal intensity includes a reception voltage level, and current signal intensity of the cell is measured by measuring current reception voltage level of the cell.

Optionally, the monitoring unit is adapted for measuring the reception level multiple times during a predetermined time interval, and obtaining an average reception voltage level according to the multiple reception voltage levels; and the gain acquiring unit is adapted for obtaining the signal gain of the non-traffic card to receive data correctly based on the average reception voltage level.

Optionally, the gain acquiring unit obtaining the signal gain of the non-traffic card to receive data correctly based on the average reception voltage level includes obtaining a signal gain to receive data correctly for the non-traffic card according to a difference between the average reception voltage level and a target reception voltage level which is a reception voltage level to receive data correctly.

Optionally, the monitoring unit monitoring the cell's BCH associated with the non-traffic card under the control of the control unit includes monitoring a serving cell's broadcast channel and/or a neighbouring cell's broadcast channel associated with the non-traffic card.

Optionally, the multi-SIM multi-standby communication device includes a triple-SIM triple-standby mobile phone.

Compared with the prior art, this disclosure has the following advantages:

The non-traffic card can obtain signal gain needed for receiving data correctly by monitoring a cell's BCH and measuring signal intensity during the idle time period of the traffic card; so that paging information may be successfully received after the traffic card finishes its service.

Because tare signal intensity of the current serving cells and/or neighbouring cells and the gain for receiving data correctly have been obtained when the traffic card is conducting a service, it can accelerate the speed for switching cells of the non-traffic card after the traffic card finishes its service.

DETAILED DESCRIPTION OF THE DISCLOSURE

Figure 1:
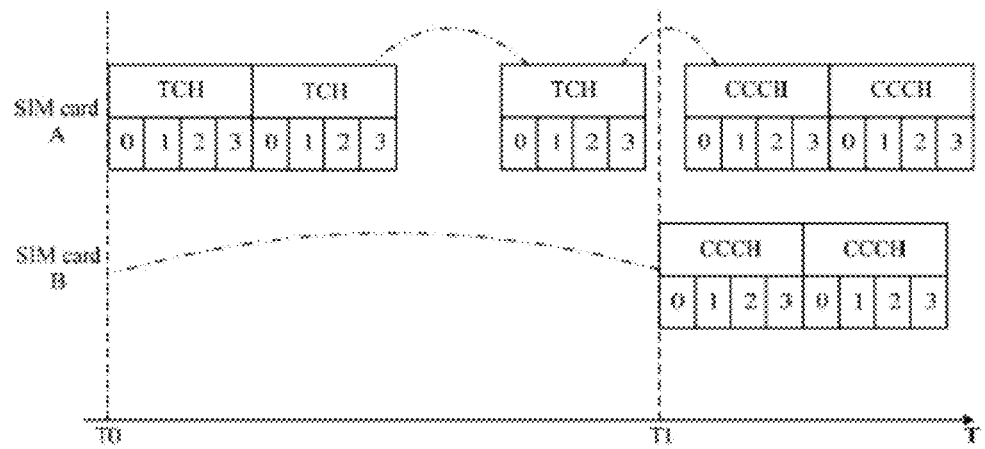
FIG. 1 is a schematic diagram illustrating data reception of a traffic card and a non-traffic card according to the conventional art.
Figure 2:
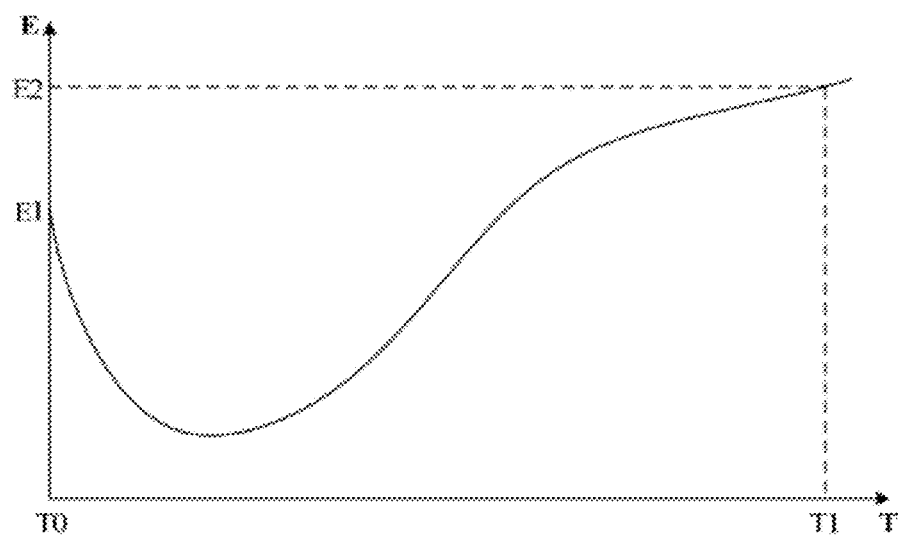
FIG. 2 is a schematic diagram of variation of the signal gain needed for the SIM card B shown in FIG. 1 to receive data correctly.

In order to clarify the objects, characteristics and advantages of the disclosure, the embodiments of the present disclosure will be described in detail in conjunction with the accompanying drawings.

The disclosure will be described with reference to certain embodiments. It will be understood by those skilled in the art that various changes may be made without departing from the spirit or scope of the disclosure. Accordingly, the present disclosure is not limited to the embodiments disclosed.

The present disclosure is applicable for communication network using Time Division Multiple Access (TDMA) technology, such as GSM communication network. Embodiments of the present disclosure will be described by taking GSM communication network as an example. The present disclosure is implemented in a multi-SIM multi-standby single-communicating communication device, which includes only a set of communication modules and multiple SIM cards. The SIM card in traffic is referred to as a traffic card, and the SIM card not in traffic is referred to as a non-traffic card. When the traffic card finishes its service, the SIM card which was in traffic turns into a non-traffic card. Service provided by the traffic card may include voice service and data service. The voice service may include making and receiving calls. And the data service may include short message service, internet access service, and the like.

A mobile communication device is also referred to as a mobile station, such as a mobile phone, which will be taken as an example hereinafter. While one of the cards in the mobile phone is in traffic, for example, receiving a call, and if it isn't conflicted completely for a non-traffic card to receive data with a traffic card to conduct a service, the multi-SIM multi-standby mobile phone cap receive data needed for the non-traffic card.

In order to better understand the present disclosure by those skilled in a frame structure in GSM communication network is briefly described hereinafter. As known in the prior art, in GSM communication network, one TDMA frame includes 8 slots (TS), and each time slot constitutes a physical channel. The physical channels can be multiplexed by reusing the time slots, so as to form a logic channel. When a user is going to conduct a communication service (in this case, the SIM card in communication service is referred to as a traffic card), a request will be applied to occupy a physical channel. Upon receiving the application, a base station assigns the user a physical channel to conduct a communication service. The user occupies at least one time slot (allowing for some services such as a voice service being two-way, which needs an uplink channel and a downlink channel, two time slots are needed), therefore, for the traffic card, the time slots unoccupied are idle (some of the unoccupied time slots may also have been or will be occupied by other users), and the unoccupied time slots constitute an idle time period of the traffic card.

In the embodiments of the present disclosure, by monitoring a cell's BCH to measure signal intensity during the idle time period of the traffic card, the non-traffic card can obtain the signal gain needed for receiving data correctly. Embodiments of the present disclosure will be described in detail in conjunction with the accompanying drawings.

Figure 3:
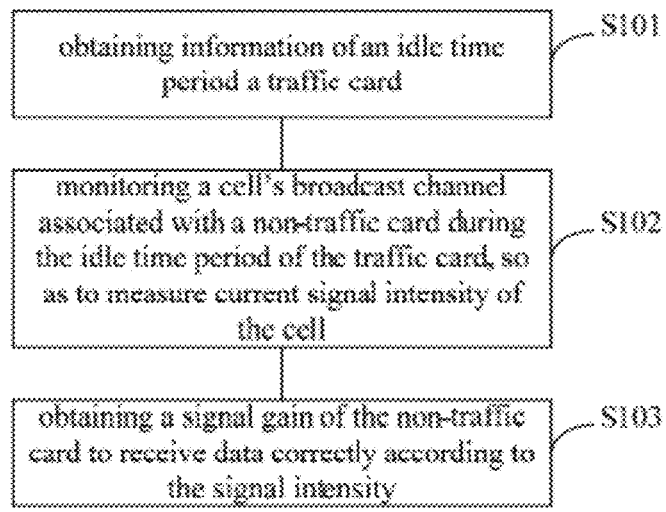
FIG. 3 is a schematic flow chart of a method for obtaining gain of an non-traffic card in a multi-SIM multi-standby communication device according to one embodiment of the present disclosure.

FIG. 3 is a schematic flow chart of a method for obtaining gain of a non-traffic card in a multi-SIM multi-standby communication device according to one embodiment of the present disclosure. Referring to FIG. 3, the method for obtaining gain of a non-traffic card according to the embodiment of the present disclosure includes the following steps.

Step S101, obtaining information of an idle time period of a traffic card;

Step S102, monitoring a cell's broadcast channel of a non-traffic card during the idle time period of the traffic card, so as to measure current signal intensity of the cell; and Step S103, obtaining a signal gain of the non-traffic card to receive data correctly according to the signal intensity.

Information of the idle time period of the traffic card described in the step 101 may include a boundary time of a traffic frame on a traffic channel, which is a start time point of each traffic frame. The idle time period of the traffic card may be obtained based on the boundary time point of the traffic frame in traffic channel. Generally, an end time point of the traffic frame of the traffic card may be calculated based on the boundary time point of the traffic frame on the traffic channel and the time duration needed for each traffic frame (in other words, the duration of one time slot, which is generally predetermined and known). And the idle time period is the time duration from the end time point of a traffic frame to the boundary time point of a next traffic frame. Specifically, the idle time period is a sum of all of the time durations in the traffic channel between the end time point of a current traffic frame and the boundary time point of a next traffic frame.

Obtaining information of the idle time period of the traffic card in the step S101 includes: Obtaining a boundary time point of a traffic frame on a traffic channel of the traffic card; and calculating an end time point of the traffic frame of the traffic card based on the boundary time point and the time duration needed for each traffic frame. The time duration from the end time point of a current traffic frame to the boundary time point of a next traffic frame is the idle time period of the traffic card, therefore, the idle time period of the traffic card may be obtained with an end time point of traffic frame and a boundary time point of the traffic frame.

Monitoring a cell's BCH associated with a non-traffic card in the step S102 includes measuring signal intensity of the current cells by receiving signal data on the cell's BCH. Generally, the signal intensity is measured by reception voltage level (or reception power). That is to say, the signal intensity of the current cells is obtained, generally, by measuring reception voltage level (or reception power) of the current cells. However, the reception voltage level may vary at different time points, therefore, the reception voltage level is measured multiple times during a predetermined time duration, and an average reception level (RxLev) is obtained by calculating the average value of the reception voltage levels measured at different time points, wherein the average reception level is used to measure the signal intensity of the predetermined time duration.

In the step S103, Obtaining the signal gain for the non-traffic card to receive data correctly based on the signal intensity generally means to obtain a signal gain of the non-traffic card which is needed for receiving data correctly based on the average receiving voltage level. In an embodiment, a target reception voltage level for receiving data correctly is predetermined, for example, a preferred reception voltage level. When receiving signal data, if there is a difference between the actual receiving level and the target receiving level which is a preferable receiving level for receiving data, the gain may be adjusted. The adjustment may be realized automatically based on the signal intensity of the actual signal by using a signal amplifier. Therefore, the signal gain of the non-traffic card which is needed for receiving data correctly can be obtained according to the difference between the average reception foliage level and the target reception voltage level.

According to the embodiment of the present disclosure, it is used to obtain gain of a non-traffic card which is needed for receiving data correctly when the traffic card is conducting a service. Generally, in a multi-SIM multi-standby single-communicating communication device, there is one traffic card with one or more non-traffic card therein. Hereunder, embodiments of the disclosure are provided to illustrate in detail the process for monitoring a cell's BCH associated with a non-traffic card during the idle time period of the traffic card.

Figure 4:
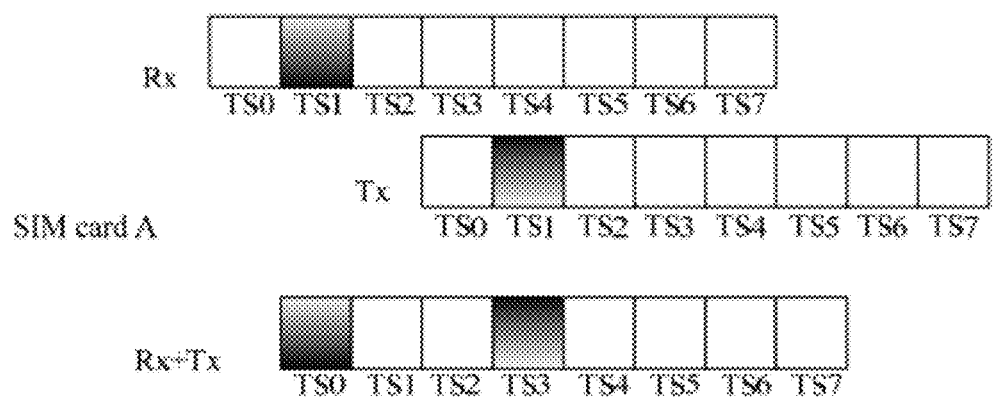
FIG. 4 is a schematic diagram illustrating a downlink channel and an uplink channel of a traffic card being combined and mapped in a TDMA frame.
Figure 5:
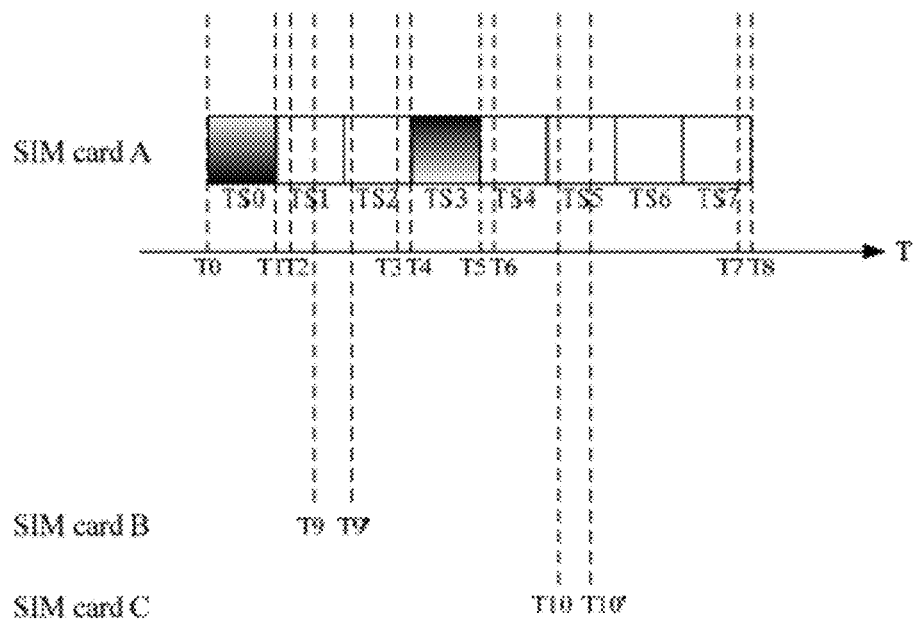
FIG. 5 is a schematic diagram illustrating monitoring a cell's BCH associated with the non-traffic card during idle time period of the traffic card.

For example, in a multi-SIM multi-standby single-communicating communication device, there are three SIM cards, such as a SIM card A, a SIM card B, and a SIM card C. If there is no service conducted for the communication device, the three SIM cards take turns to monitor a cell's BCH with one set of communication system. Assuming that paging information of SW card A is received at a certain time, which means that an in-coming call arrives, if a user answers the call to conduct a voice service, in this case, the SIM card A is referred to as an traffic card, and SIM cards B and C are referred to as a non-traffic card. In generally, two time slats are occupied by SIM card A to conduct a voice communication service, one of which acts as an uplink channel, the other as a downlink channel. In light of logical channel, the uplink and downlink channels both are a traffic channel. In a matter of fact, the uplink channel and the downlink channel use different frequencies, accordingly, the uplink channel and the dozy link channel are in different TDMA frames. However, the uplink channel and the downlink channel still can be mapped into one TDMA frame to show occupation of time slots of a traffic card, as shown in FIG. 4. FIG. 4 is a schematic diagram illustrating a downlink channel and an uplink channel of a traffic card being combined and mapped in a TDMA frame. As shown in FIG. 4, assuming that the SIM card A is conducting a service, the downlink channel (Rx) occupies time slot 1 (TS1) of a first TDMA frame where the downlink channel locates, and that the uplink channel (Tx) occupies time slot 1 (TS1) of a second TDMA frame where the uplink channel locates, if the downlink channel (Rx) and the uplink channel (Tx) are mapped into one TDMA frame, the downlink channel (Rx) and the uplink channel (Tx) may occupy time slot 0 (TS0) and time slot 3 (TS3) respectively of the TDMA frame mapped with the first TDMA frame and the second TDMA frame. FIG. 5 is a schematic diagram illustrating monitoring a cell's BCH associated with the non-traffic card during idle time period of the traffic card. FIG. 5 shows 8 time slots from TS0 to TS7 contained in a TDMA frame (the TDMA frame mapped with the downlink channel and the uplink channel) of a SIM card A (acting as the traffic card), where TS0 is assigned to the SIM card A as the downlink channel, and TS3 is assigned to the SIM card A as the uplink channel. On the horizontal axis T, T0 represents a start time point of the time slot TS0 in a traffic channel that SIM card A occupies to conduct a service, namely, a boundary time point of a traffic frame in downlink channel. Besides T1 represents an end time point of TS0. Similarly T4 and T5 represent a start time point and an end time point of the time slot TS3 respectively. Since TS3 is used as the uplink channel of transmitting traffic frame, T4 is a boundary time point of the traffic frame in the uplink channel of the SIM card A. T8 represents an end time point of TS7. As shown in FIG. 5, TS0 and TS3 are occupied as traffic channels by the SIM card A named traffic card. The remained time slots such as TS1, TS2, and TS4 to TS7 are in an idle state for the SIM card A, which constitute idle time period of the SIM card A. Specifically, the idle time period is a sum of a time period between T1 and T4 and a time period between T5 and T8. There is no service conducted during the idle time period of SIM card A, of which may be made use to monitor a cell's BCH associated with the SIM card B and the SIM card C respectively, so as to measure current signal intensity of the cells to obtain signal gain needed for receiving data correctly of the SIM card B and SIM card C respectively. In an embodiment, in order to obtain the idle time period of the SIM card A, boundary time points T0 and T4 of the traffic frame of the SIM card A need to be obtained. The information of the boundary time points of the traffic frame has been already stored in the mobile phone when assigning channels. Because the time period of one time slot from the boundary time point, such as T0 or T4, is predetermined and known, which is about 577 ms (15/26 ms), the end time points, such as T1 or T5 correspondingly, may be obtained, additionally, the end time point T8 of the TDMA frame may also be obtained. In an embodiment, T1, T5 and T8 are stored in the mobile phone as well. Thus, the idle time period of the SIM card A, including the time period between T1 and T4 and the time period between T5 and T8, can be obtained.

Accordingly, to monitor a cell's BCH associated with the SIM card B and SIM card C respectively, a first condition is that both a start time point and an end time point for monitoring a cell's BCH associated with SIM card B and SIM card C respectively falls within the idle time period of the SIM card A. Still referring to FIG. 5, the start time point and the end time point for monitoring a cell's BCH associated with SIM card B are T9 and T9' respectively. Therefore, the condition to monitor a cell's BCH associated with SIM card B is that both the star time point and the end time point for monitoring a cell's BCH associated with the SIM card B fall within the idle time period of the SIM card A, namely, T9 and T9' fall within the time period from T1 to T4, or within the time period from T5 to T8. Similarly, the start time point and the end time point for monitoring a cell's BCH associated with SIM card C are T10 and T10' respectively. The condition to monitor a cell's BCH associated with SIM card C is that both the start time point and the end time point for monitoring cells' BCH associated with SIM card C fail within the idle time period of SIM card A, namely, T10 and T10' fall within the time period from T1 to T4, or within the time period from T5 to T8. Besides, the time period for monitoring a cell's BCH associated with SIM card B should not conflict with the time period for monitoring a cell's BCH associated with SIM card C, namely, the time period from T9 to T9' should not overlap completely or partly with the time period from T10 to T10'. In an embodiment, the time periods for monitoring a cell's BCH associated with each non-traffic card may be managed by the mobile phone.

Additionally, the SIM cards A, B, and C generally use different frequencies. Therefore, in order to monitor a cell's BCH associated with SIM card B and C respectively when, the SIM card A is conducting its service in the occupied time slots, there is a need to switch frequencies by using a RE chip of the mobile phone during the idle time period of the SIM card A. However, the time duration to switch frequencies should be stable, which is also referred to as a guard time period and falls within the idle time period. As shown in FIG. 5, the SIM card A occupies the time slot TS0 in its frequency to conduct a service, namely, the time period from T0 to T1 is occupied. Afterwards, frequency of the SIM card B or SIM card C needs to be switched to, so as to monitor a cell's BCH associated with SIM card B or SIM card C respectively. The occupation of the guard time period can also be predetermined, for example, starting at T1 and ending at T2, as shown in FIG. 5. Accordingly, the time period from T1 to T2 is the guard time period. Similarly, switching frequencies also occurs within the time periods from T3 to T4, T5 to T6, and T7 to T8 as shown in FIG. 5, which thereby constitutes guard time periods and should be unoccupied in the idle time period of SIM card A. Therefore, to monitor a cell's BCH associated with SIM card B and SIM card C respectively, a second condition is that the start time point for monitoring a cell's BCH associated with SIM card B and SIM card C respectively does not fall within the guard time period. In an embodiment, it is achieved by ensuring that any one of T9, 19', T10, and T10' doesn't fall within any one of the time periods from T1 to T2, T3 to T4, 15 to T6, and T7 to T8, so that both the start time point and the end time point for monitoring a cell's BCH respective of SIM card B and SIM card C do not occupy the guard time period.

In addition, it should be noted that while conducting a service, there is still a need to monitor the signal intensity of BCH of a serving cell and a neighbouring cell associated with the traffic card so as to obtain a gain needed for receiving data correctly. Such a monitoring is performed during the idle time period of the traffic card as well. If there is a conflict between the time period for monitoring a cell's BCH associated with the non-traffic card and the time period for monitoring a cell's BCH associated with the traffic card, the cell's BCH associated with the traffic card should be monitored with priority, and another time period should be configured for monitoring the cell's BCH associated with the non-traffic card.

In conclusion, to monitor a cell's BCH associated with the non-traffic card during the idle time period of the traffic card, the condition includes that the start time point and the end time point for monitoring a cell's BCH associated with the non-traffic card fall within the idle time period of the traffic card, while not within the guard time period of the idle time period of the traffic card and not within the time period for monitoring a cell's BCH associated with the traffic card. Referring to FIG. 5, in an embodiment, the gain of the signal to receive data correctly can be obtained while the SIM card A is in traffic by monitoring a cell's BCH associated with the SIM card B and SIM card C to obtain the signal intensity of the current cells on the condition that the start time point T9 and the end time point T9' for monitoring the cell's BCH associated with SIM card B, and the start time point T10 and the end time point T10' for monitoring the cell's BCH associated with SIM card C falls within the time period from T2 to T3 or from T6 to T7, that the time period from T10 to T10' does not overlap with the time period from T9 to T9' completely, or even partly, and that the time period from T9 to T9' and the time period from T10 to T10' does not overlap completely, or even partly with the time period (not shown) for monitoring the cell's BCH associated with the traffic card.

In an embodiment, the signal intensity can be obtained by receiving several data segments of a cell's BCH rather than a whole traffic frame to monitor the cell's BCH associated with the non-traffic card, accordingly, it doesn't occupy one time slot, and generally, about half a time slot. Usually, there are about 6 time slots in the idle time period of a TDMA frame (the guard time periods need to be subtracted from the idle time period) to be configured to monitor the cell's BCH associated with the non-traffic card, so that the current signal intensity of the cells may be measured in time to obtain the signal gain needed for receiving data correctly, thereby greatly reducing the risk of the non-traffic card failing to receive data correctly, or even losing the network connection, after the traffic card finishes its service.

Monitoring the cell's BCH associated with the non-traffic card includes monitoring not only the broadcast channel of the current serving cell but also the broadcast channels of the neighbouring cells of the non-traffic card. Although the non-traffic card can not switch cells during the traffic card is conducting service, the signal gain needed for receiving data of each cell correctly is already obtained by monitoring the serving cell's BCH and the neighbouring cells' BCH, thereby accelerating the speed for selection and switching cells of the non-traffic card after the traffic car finishes its service. After the traffic card finishes its service, all the SIM cards inserted in the mobile phone turn into non-traffic cards and the cell's BCH associated with which would be monitored in turn so that multiple SIM cards are set in standby state, at this moment, cells (including a cell that the non-traffic card camps on and neighbouring cells of the non-traffic card) should be selected. In general, cells are selected depending on the signal intensity of each cell, the cell having the highest signal intensity may be selected as the first choice to be resident (of course, may be excluded due to the exceptional cases such as cells forbidden or priority selection), the cell having the second highest signal intensity may be selected as a backup, and so on, generally, six neighbouring cells having the highest signal intensity may be selected to ensure a high speed of switching cells and a high quality of connection. Because the signal gain needed for receiving data correctly has already been obtained during the traffic card is conducting a service by monitoring the serving cell's BCH and the neighbouring cells' BCH, the selecting and switching cells can be performed quickly.

Figure 6:
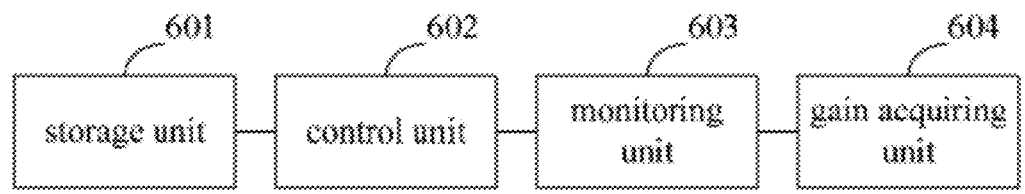
FIG. 6 is a schematic structure diagram of a multi-SIM multi-standby communication device according to one embodiment of the present disclosure.

Based on the embodiments of the method for obtaining gain of non-traffic card in multi-SIM multi-standby communication device, according to the embodiments of the present disclosure, there is further provided a multi-SIM multi-standby communication device. FIG. 6 is a schematic structure diagram of a multi-SIM multi-standby communication device according to one embodiment of the present disclosure. As shown in FIG. 6, the multi-SIM multi-standby communication device includes a storage unit 601, a control unit 602, a monitoring unit 603, and a gain acquiring unit 604. The storage unit 601 is adapted for storing idle time period of a traffic card. The control unit 602 is adapted for obtaining the idle time period of the traffic card stored in the storage unit, and controlling a monitoring unit 603 to monitor a cell's BCH associated with a non-traffic card during the idle time period of the traffic card. The monitoring unit 603 is adapted for monitoring the cell's BCH associated with the non-traffic card under the control of the contra 602, and measuring current signal intensity of the cell. And the gain acquiring unit 604 is adapted for calculating signal gain of the non-traffic card needed for receiving data correctly based on the signal intensity measured by the monitoring unit 603.

In an embodiment, the multi-SIM multi-standby communication device may be a multi-SIM multi-standby mobile phone, such as a conventional dual-SIM dual-standby mobile phone, or triple-SIM triple-standby mobile phone. The storage unit 601 stores the information of boundary time point of traffic frame on a traffic channel of the traffic card (the boundary time point is a start time point of each traffic frame), and the information of idle time period of the traffic card obtained based on the boundary time point of traffic frame. Generally, an end time point of traffic frame of the traffic card may be calculated based on the boundary time point of traffic frame on the traffic channel and time needed for each traffic frame (in other words, the duration of one time slot, which is generally predetermined and known). And the idle period is the time duration from the end time point of a traffic frame to the boundary time point of a next traffic frame. Specifically, the idle time period is a sum of all of the time durations in the traffic channel between the end time point of a current traffic frame and the boundary time point of a next traffic frame. On the occasion that the traffic card conducts a service, the control unit 602 is enabled by a predetermined trigger mechanism to obtain information of idle time period of the traffic card stored in the storage unit, and to transmit a control instruction to the monitoring unit 603 based on the information of idle time period. The monitoring unit 603 monitors a cell's BCH associated with a non-traffic card and measures current signal intensity of the cell during the idle time period of the traffic card under the control of the control unit 602. The monitoring unit 603 includes a RF module for receiving and transmitting signal data so as to measure current signal intensity of the cell by measuring reception level, and to obtain an average reception level by calculating multiple reception levels measured during a predetermined time interval. In addition, the RF module can switch frequencies when the frequency of receiving or transmission varies. The gain acquiring unit 604 includes a signal amplifier which can adjust signal gain automatically according to the signal intensity of the actual signal. The signal gain of the non-traffic card needed for receiving data correctly can be obtained based on the difference between the average receiving level and the target receiving level (the target reception level is predetermined as a preferred reception level for receiving data correctly).

The operation of the multi-SIM multi-standby communication device about obtaining signal gain needed for the non-traffic card to receive data correctly during the idle time period of the traffic card when the traffic card is conducting a service by monitoring a cell's BCH associated with non-traffic card so as to measure current signal intensity of the cell can refer to the above described method for obtaining gain of non-traffic card in multi-SIM multi-standby communication device, thus no more details will be described.

To sum up, the multi-SIM multi-standby communication device and the method for obtaining gain of non-traffic card thereof according to embodiments of the present disclosure have the following advantages.

When the traffic card is conducting a service, signal gain needed for non-traffic card to receive data correctly is able to obtained by monitoring a cell's BCH to measure signal intensity during the idle time period of the traffic card, so that the non-traffic card receives paging information successfully after the traffic card finishes its service, thus reducing the risk of losing the network due to failure to receive data of the cell's BCH correctly during the traffic card is conducting its service.

Because signal intensity of a serving cell and/or neighbouring cells and gain for receiving data correctly have been obtained by the non-traffic card during the traffic card is conducting a service, it is possible to accelerate the speed for selection and switching cells of the non-traffic card after the traffic card finishes its service.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A method for obtaining gain for a SIM (Subscriber Identity Module) card in a multi-SIM multi-standby communication device, comprising:
   obtaining, by the communication device, information associated with duration of an idle time period during which communication service is inactive for a first SIM card that is in a traffic mode;
   initializing, by the communication device, a request to monitor and obtain a signal gain;
   monitoring, by the communication device, during a first interval within the idle time period that is of duration less than a traffic frame time slot, a broadcast channel associated with a second SIM card that is in a non-traffic mode, to determine a current signal intensity of a particular cell; and
   obtaining, by the communication device, based on the current signal intensity, the signal gain for the second SIM card to correctly receive communication service data when the first SIM card is switched to the non-traffic mode and the second SIM card is switched to the traffic mode; wherein
      the idle time period comprises a plurality of unoccupied guard time periods that are of duration to provide for stable frequency switching for monitoring the broadcast channel associated with the second SIM card,
      the first interval comprises a first start time point that falls within a first traffic frame slot in an idle state and an first end time point that falls within a second traffic frame slot in the idle state to monitor the broadcast channel associated with the first SIM card,
      a second interval comprises a second start time point that falls within a third traffic frame slot in an idle state and a second end time point that falls within the third traffic frame slot in the idle state to monitor the broadcast channel associated with the second SIM card, and
      the first interval and the second interval do not occupy the unoccupied guard time period.

2. The method according to claim 1, wherein the step of obtaining information associated with duration of the idle time period comprises:
   obtaining a boundary time point of a traffic frame on a traffic channel of the first SIM card;
   obtaining an end time point of the traffic frame based on the boundary time point and a time period of each traffic frame; and
   obtaining the idle time period which is from the end time point of a current traffic frame to the boundary time point of a next traffic frame.

3. The method according to claim 1, wherein the step of monitoring the broadcast channel associated with the second SIM card during the idle time period is achieved by ensuring that both a start time point and an end time point for monitoring the broadcast channel associated with the second SIM card falls outside of the guard time period.

4. The method according to claim 1, further comprising monitoring a broadcast channel associated with the first SIM card.

5. The method according to claim 3, wherein the step of monitoring the broadcast channel associated with the second SIM card during the idle time period is achieved by ensuring both the start time point and the end time point for monitoring the broadcast channel associated with the second SIM card falls outside of a time period for monitoring the broadcast channel associated with the first SIM card.

6. The method according to claim 1, further comprising measuring a current reception voltage level to determine the current signal intensity of the particular cell.

7. The method according to claim 6, comprising:
   measuring reception voltage level multiple times during a predetermined time interval;
   obtaining an average reception voltage level according to the measured reception voltage levels; and
   obtaining the signal gain for the second SIM card based on the average reception voltage level.

8. The method according to claim 7, further comprising obtaining the signal gain for the second SIM card according to a difference between the average reception voltage level and a target reception voltage level which is a reception voltage level to receive data correctly.

9. The method according to claim 1, wherein the step of monitoring the broadcast channel associated with the second SIM card comprises monitoring at least one of a serving cell broadcast channel associated with the second SIM card and a neighboring cell broadcast channel associated with the second SIM card.

10. The method according to claim 1, wherein a third SIM card of the communication device is in non-traffic mode during the idle time period.

11. The method according to claim 1, wherein the first SIM card and the second SIM card use a TDMA (Time Division Multiple Access) communication network.

12. A multi-SIM (Subscriber Identity Module) multi-standby communication device, comprising:
   a storage unit adapted for storing information associated with duration of an idle time period during which communication service is inactive for a first SIM card of the communication device when the first SIM card is in a traffic mode;
   a monitoring unit adapted for monitoring at least a broadcast channel associated with a second SIM card of the communication device, wherein a current signal intensity of a particular cell is determined based on the monitoring;
   a control unit adapted for controlling the first SIM card and the second SIM card, for obtaining the information of the idle time period stored in the storage unit, and for controlling the monitoring unit to monitor during a first interval within the idle time period that is of duration less than a traffic frame time slot of a TDMA (Time Division Multiple Access) traffic frame a broadcast channel associated with the second SIM card that is in a non-traffic mode when the first SIM card is in the traffic mode; and
   again acquiring unit adapted for calculating a signal gain, based on the current signal intensity, for the second SIM card to correctly receive communication service data when the first SIM card is switched to the non-traffic mode and the second SIM card is switched to the traffic mode; wherein
      the idle time period comprises a plurality of unoccupied guard time periods that are of duration to provide for stable frequency switching for monitoring the broadcast channel associated with the second SIM card,
      the first interval comprises a first start time point that falls within a first traffic frame slot in an idle state and an first end time point that falls within a second traffic frame slot in the idle state to monitor the broadcast channel associated with the first SIM card, a second interval comprises a second start time point that falls within a third traffic frame slot in an idle state and a second end time point that falls within the third traffic frame slot in the idle state to monitor the broadcast channel associated with the second SIM card, and the first interval and the second interval do not occupy the unoccupied guard time period.

13. The communication device according to claim 12, wherein the control unit is further adapted for obtaining a boundary time point of a traffic frame on a traffic channel of the first SIM card;

obtaining an end time point of the traffic frame based on the boundary time point and a time period of each traffic frame; and obtaining the idle time period which is from the end time point of a current traffic frame to the boundary time point of a next traffic frame.

14. The communication device according to claim 12, wherein the monitoring unit is further adapted for ensuring that both a start time point and an end time point for monitoring the broadcast channel associated with the second SIM card fall outside of the guard time period.

15. The communication device according to claim 12, wherein the monitoring unit is further adapted for monitoring a broadcast channel associated with the first SIM card.

16. The communication device according to claim 15, wherein the monitoring unit is further adapted for ensuring both the start time point and the end time point for monitoring the broadcast channel associated with the second SIM card falls outside a time period for monitoring the broadcast channel associated with the first SIM card.

17. The communication device according to claim 12, wherein the signal intensity comprises a reception voltage level, and current signal intensity is measured by measuring current reception voltage level.

18. The communication device according to claim 17, wherein:

the monitoring unit is further adapted for measuring reception voltage level multiple times during a predetermined time interval, and obtaining an average reception voltage level according to measured reception voltage levels; and the gain acquiring unit is further adapted for obtaining the signal gain for the second SIM based on the average reception voltage level.

19. The communication device according to claim 18, wherein the gain acquiring unit is further adapted for obtaining the signal gain for the second SIM card according to a difference between the average reception voltage level and a target reception voltage level which is a reception voltage level to receive data correctly.

20. The communication device according to claim 12, wherein the monitoring unit is further adapted for monitoring at least one of a serving cell broadcast channel associated with the second SIM card and a neighboring cell broadcast channel associated with the second SIM card.

21. The communication device according to claim 12, wherein the multi-SIM multi-standby communication device comprises a triple-SIM triple-standby mobile phone.

\* \* \* \* \*